(12) United States Patent
Choi

(10) Patent No.: US 6,815,339 B2
(45) Date of Patent: Nov. 9, 2004

(54) METHOD FOR FORMING COPPER METAL LINE IN SEMICONDUCTOR DEVICE

(75) Inventor: Kyeong Keun Choi, Suwon-Shi (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/323,883

(22) Filed: Dec. 20, 2002

(65) Prior Publication Data

US 2004/0002212 A1 Jan. 1, 2004

(30) Foreign Application Priority Data

Jun. 29, 2002 (KR) ................................ 10-2002-0037326

(51) Int. Cl.[7] .......................................... H01L 21/4763
(52) U.S. Cl. ...................... 438/634; 438/637; 438/643; 438/653; 438/672; 438/675; 438/678
(58) Field of Search ................................. 438/633–634, 438/637–639, 643, 645, 653, 656, 672, 675, 678, 685; 257/750, 762, 774

(56) References Cited

U.S. PATENT DOCUMENTS

| | | | | |
|---|---|---|---|---|
| 6,144,099 A | * | 11/2000 | Lopatin et al. | 257/758 |
| 6,492,270 B1 | * | 12/2002 | Lou | 438/687 |
| 2002/0036143 A1 | * | 3/2002 | Segawa et al. | 205/187 |
| 2002/0098681 A1 | * | 7/2002 | Hu et al. | 438/626 |

* cited by examiner

*Primary Examiner*—Hsien-Ming Lee
(74) *Attorney, Agent, or Firm*—Piper Rudnick LLP (57) ABSTRACT

The present invention relates to a method of forming a copper metal line in a semiconductor device. A via plug and a copper metal line are independently formed using a single damascene process. A buffer film is formed between the via plug and the copper metal line. It is thus possible to prevent lowering in the yield of a via hole that occurs due to a thermal stress in a subsequent process and diffusion of Cu atoms. Therefore, the yield of the copper metal line can be improved.

5 Claims, 8 Drawing Sheets

METHOD FOR FORMING COPPER METAL LINE IN SEMICONDUCTOR DEVICE

BACKGROUND OF THE INVENTION

1. Field of the Invention

The invention relates generally to a method of forming a copper metal line in a semiconductor device. More particularly, the invention relates to a method of forming a copper metal line in a semiconductor device capable of preventing void that occurs within a via hole upon a process of forming a copper electroplating film to prohibit lowering in the yield of the via hole, and preventing damage of an underlying conductive material and a lower layer that occurs upon a process of forming a trench due to misalignment of the via hole and a conductive region.

2. Description of the Prior Art

Generally, in a semiconductor device, electron devices, or the like, a technology in which a conductive film such as aluminum (Al), tungsten (W), or the like is deposited on an insulating film and the conductive film is then patterned by common photolithography process and dry etching process to form a line, has been widely employed as a technology for forming the line. In particular, as an effort to reduce a RC delay time in a logic device of the semiconductor device that requires a high speed, a research on the use of a metal such as copper (Cu) having a low resistivity as the line instead of aluminum (Al) or tungsten (W) has recently been made.

In the process of forming the line using copper (Cu), however, as the patterning process of Cu is difficult compared to those of Al or W, a process by which a trench is formed and the trench is then buried to form the line, so called a damascene process has been used. The damascene process can be classified into a single damascene process by which a via hole is formed, the via hole is filled with a via conductive material and the trench for the line is then formed to bury the line, and a dual damascene process by which the via hole and the trench are formed and the via hole and the trench for the line are simultaneously filled with a material for the line. In general, in view of simplification of the process, the dual damascene process is better than the single damascene process.

The dual damascene process can be classified into a pre-via mode in which the via hole is first formed and the trench is then formed, and a post-via mode in which the trench for the line is first formed and the via hole is then formed. Generally, it has been known that the pre-via mode is better than the post-via mode in view of secure connection with the lower layer. A method of forming the copper metal line using the conventional dual damascene process of the pre-via mode will be described by reference to FIG. 3A through FIG. 3E.

Figure 3A:
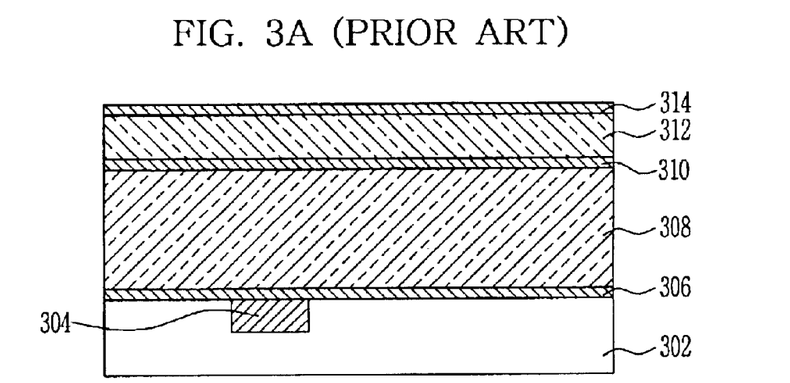
FIG. 3A through FIG. 3E are cross sectional views of semiconductor devices for explaining a conventional method of a copper metal line.

Referring now to FIG. 3A, a first etch stop layer 306 that will serve as an etch stop layer in a subsequent process of forming a via hole is formed on a given lower layer 302 including a conductive region 304 using a SiN film, etc. Next, a first interlayer insulating film 308 is formed on the first etch stop layer 306 using silicon oxide having a low dielectric characteristic. A second etch stop layer 310 that will serve as the etch stop layer in a process of forming a trench for a line is then formed.

Thereafter, a second interlayer insulating film 312 is formed on the second etch stop layer 310 using silicon oxide having a low dielectric constant. Next, an insulating anti-reflecting film 314 that will have an anti-reflecting function in a subsequent process of patterning a photoresist is formed.

Figure 3B:
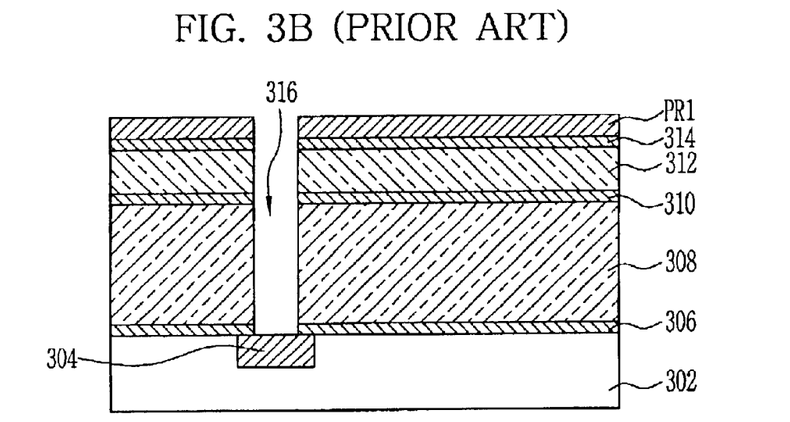

By reference to FIG. 3B, a photoresist (not shown) is formed on the entire structure. An exposure process and a development process are sequentially performed to form a photoresist pattern PR1 for the via hole.

Next, the anti-reflecting film 314, the second interlayer insulating film 312, the second etch stop layer 310 and the first interlayer insulating film 308 are anisotropically etched using the photoresist pattern PR1 as an etch mask, thus forming the via hole 316. At this time, a portion of the first etch stop layer 306 is etched. Further, all the first etch stop layer 306 may be etched, for necessary. Then, the photoresist pattern PR1 is removed by a strip process.

Figure 3C:
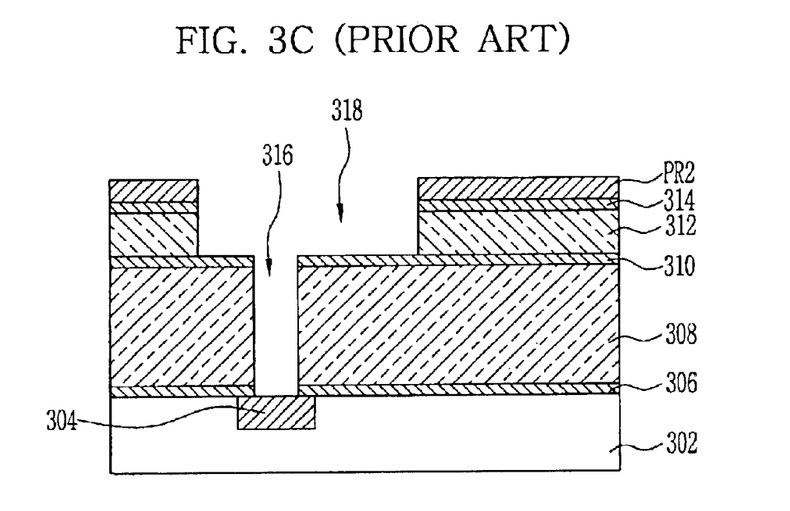

Referring to FIG. 3C, a photoresist (not shown) is formed on the entire structure. An exposure process and a development process are sequentially performed to form a photoresist pattern PR2 for the trench.

Next, the anti-reflecting film 314 and the second interlayer insulating film 312 are etched using the photoresist pattern PR2 as an etch mask, thus forming the trench 318. At this time, a portion of the second etch stop layer 310 is etched. Also, all the first etch stop layer 306 may be etched, for necessary. Then, the photoresist pattern PR2 is removed a strip process, for example by ashing using oxygen plasma.

Figure 3D:
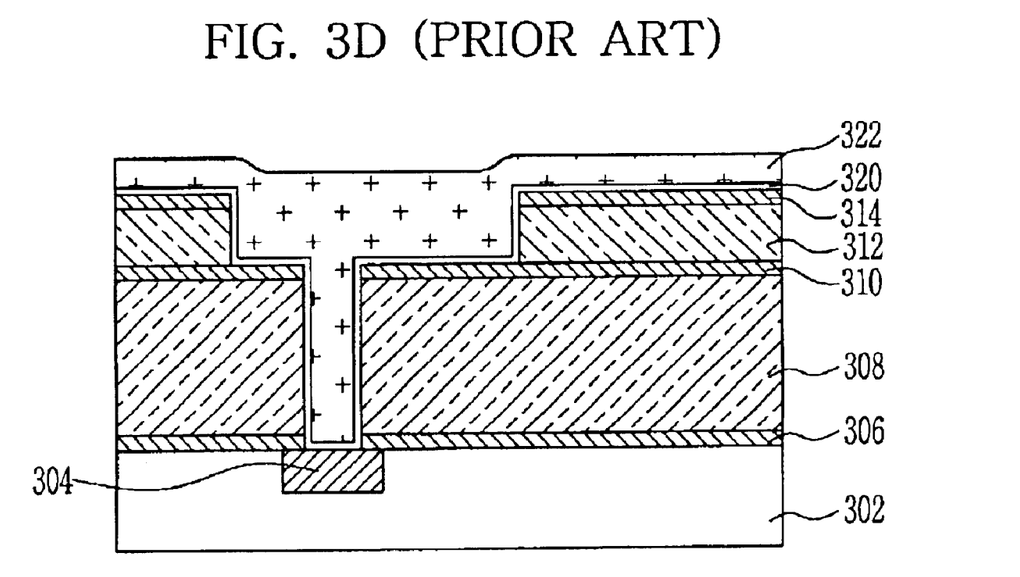

Referring to FIG. 3D, a barrier layer 320 is formed using Ti, TiN, Ta or TaN on the entire structure including inner surfaces (i.e., including inner surfaces and bottom) of the via hole 316 and the trench 318.

Thereafter, a copper electroplating film 322 is formed to bury the via hole 316 and the trench 318. Before the copper electroplating film 322 is formed, a copper seed layer (not shown) is formed on the barrier layer 320.

Figure 3E:
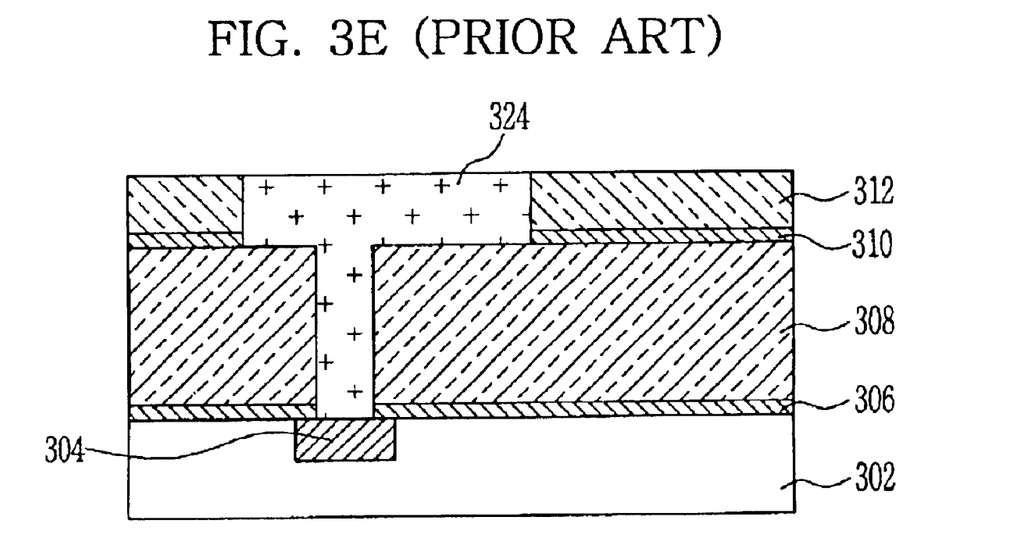

By reference to FIG. 3E, an annealing process is performed in order to crystallize the copper electroplating film 322. A chemical mechanical polishing (CMP) process is then performed to remove the anti-reflecting film 314, the barrier layer 320, the seed layer and the electroplating film 322 formed on the second interlayer insulating film 312, thus forming a copper metal line 324.

Figure 4:
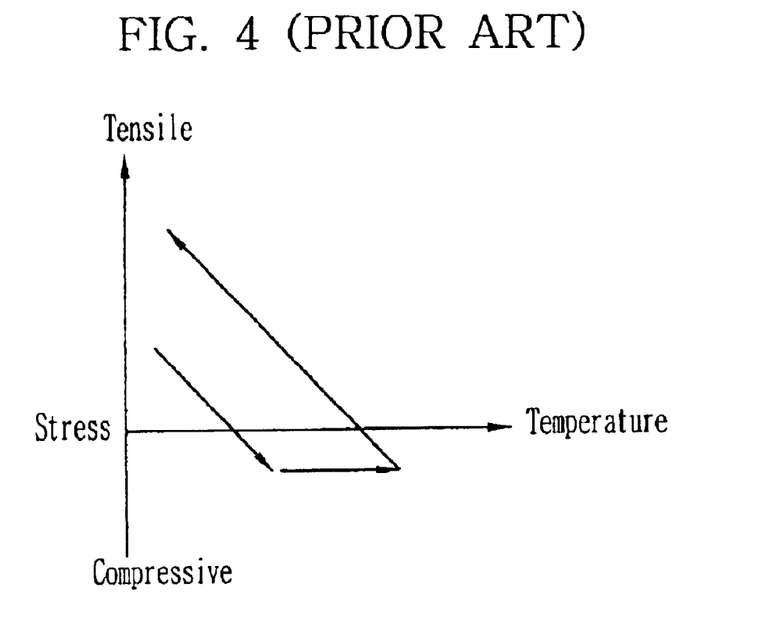
FIG. 4 is a graph showing variation in stress of the copper metal line depending on variation of the temperature.
Figure 5A:
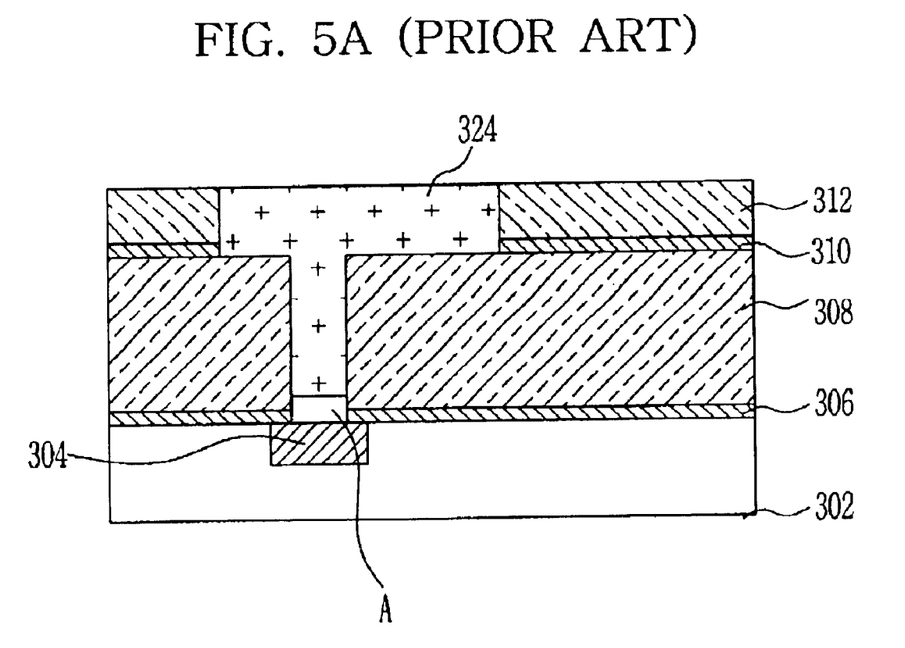
FIG. 5A is cross sectional view of the semiconductor device illustrating void within the via hole generating depending on a method of forming the copper metal line in a prior art.
Figure 5B:
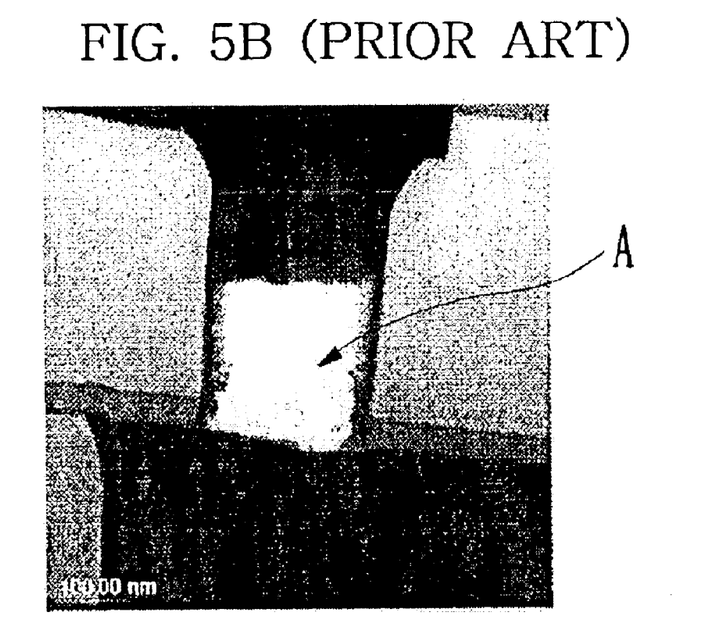
FIG. 5B is TEM photography corresponding to FIG. 5A.
Figure 6:
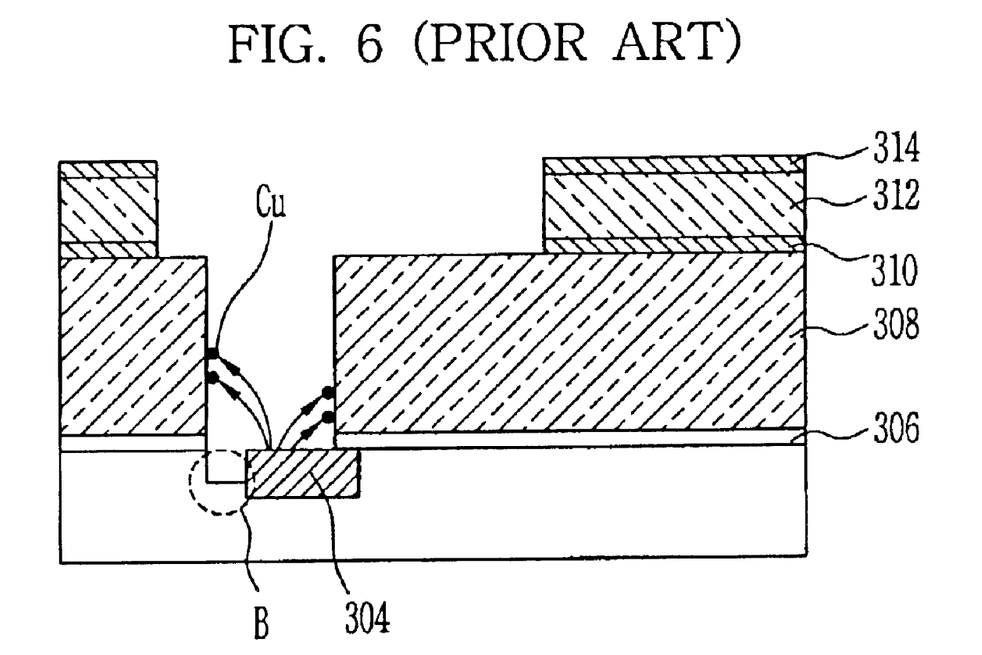
FIG. 6 is a cross sectional view of the semiconductor device illustrating re-sputtering of copper (Cu) atoms generating upon a process of forming a trench depending on a method forming a copper metal line in a prior art.

However, the method of forming the copper metal line mentioned above, has some problems. In concrete, as shown in FIG. 4, thermal stress applied to the copper metal line is significantly varied depending on variation in the temperature. In particular, if the temperature is higher, thermal stress is significantly increased. Accordingly, void (see portion 'A' in FIG. 5A and FIG. 5B) is formed between the copper metal line 324 and the conductive region 304 due to hillock by thermal stress applied in the subsequent high-temperature annealing process, as shown in FIG. 5A and FIG. 5B. Further, as shown in FIG. 6, if misalignment (see portion 'B') is generated in the process of forming the via hole 316 (see FIG. 3B), the lower layer 302 is over etched and a portion of the conductive material of the conductive region 304, for example, the thin copper film is over etched, in the subsequent process of forming the trench 318 (see FIG. 3C). Due to this, there is a problem that copper (Cu) ions are re-sputtered on the inner surface of the via hole 316.

SUMMARY OF THE INVENTION

The present invention is contrived to solve the above problems and an object of the present invention is to prevent void generating within a via hole in the process of forming a copper electroplating film and thus prohibit lowering in the yield of the via hole.

Another object of the present invention is to prevent damage of an underlying conductive material and a lower layer occurring in the process of forming a trench, due to misalignment of the via hole and a conductive region.

Still another object of the present invention is to prevent atoms of a conductive material from being re-sputtered on the inner surface of the via hole by damage of the conductive material in the process of forming the trench, due to misalignment of the via hole and the conductive region.

Further still another object of the present invention is to prohibit lowering in the yield of the via hole and also improve the yield of the copper metal line by preventing diffusion of Cu atoms.

In order to accomplish the above object, the method of forming the copper metal line according to the present invention, is characterized in that it comprises the steps of forming a first interlayer insulating film on a semiconductor substrate in which a lower layer is formed, forming an etch stop layer on the first interlayer insulating film, etching the etch stop layer and the first interlayer insulating film to form a via hole, forming a via plug to bury the via hole, forming a buffer film covering the via plug in order to buffer a stress applied in a subsequent process, forming a second interlayer insulating film on the entire structure, etching the second interlayer insulating film to form a trench through which the buffer film is exposed, and forming a copper metal line to bury the trench.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

FIG. 1A through FIG. 1G are cross sectional views of semiconductor devices for explaining a method of a copper metal line according to a first embodiment of the present invention.

Figure 1A:
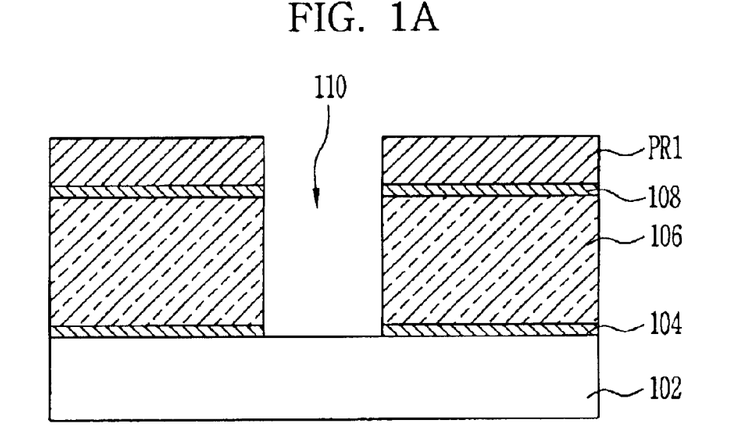
FIG. 1A through FIG. 1G are cross sectional views of semiconductor devices for explaining a method of a copper metal line according to a first embodiment of the present invention.

Referring now to FIG. 1A, a via etch stop layer 104 (hereinafter called 'first etch stop layer') that will serve as an etch stop layer in a subsequent etch process for forming a via hole 110 is deposited on a semiconductor substrate 102 in which a given lower layer (not shown) is formed. At this time, the lower layer may be a line layer made of a conductive film, or an insulating layer made of an insulating film. In case of the line layer, the first etch stop layer 104 is formed using a SiN film, etc.

Next, an insulating film 106 (hereinafter called 'first interlayer insulating film') is deposited on the entire structure using a material of a low dielectric constant, for example, silicon oxide, fluorine-containing silicon oxide, fluorine-containing oxide, or the like. Generally, fluorine-containing silicon oxide has a lower dielectric constant than silicon oxide. The dielectric constant may be controlled by adjusting the amount of fluorine.

Thereafter, a trench etch stop layer 108 (hereinafter called 'second etch stop layer') that will serve as the etch stop layer in a subsequent process for forming a trench 124 (see FIG. 1E) is deposited on the entire structure. For example, the second etch stop layer 108 is formed using the SiN film, etc., similar to the first etch stop layer 104. When a subsequent via plug 118 (see FIG. 1C) is formed using Cu, the second etch stop layer 108 is formed using a Cu anti-diffusion film in order to prevent diffusion of Cu atoms.

Then, a photoresist (not shown) is coated on the entire structure by means of a single damascene process in order to form a single damascene pattern. An exposure process and a development process are sequentially performed using a photo mask, thus forming photoresist patterns PR1 for the via hole on portions of the second etch stop layer 108 so that the patterns PRI can have a profile shape of the subsequent via plug 118.

Next, the second etch stop layer 108, the first interlayer insulating film 106 and the first etch stop layer 104 are sequentially etched by an etch process using the photoresist patterns PR1 as an etch mask, thus forming a region 100 where the subsequent via plug 118 (see FIG. 1C) will be formed (hereinafter called 'via hole'). The photoresist pattern sPR1 are then removed by a strip process.

Figure 1B:
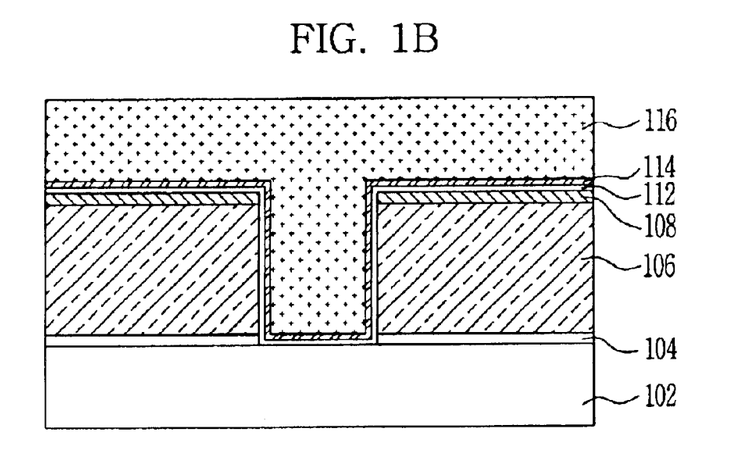

Referring now to FIG. 1B, a barrier layer 112 (hereinafter called 'first barrier layer') that will serve to prevent diffusion of Cu atom is deposited in thickness of 50 through 300 Å on the entire structure including an inner surface of the via hole 110, that is, the inner surface and the bottom surface of the via hole 110. For example, the first barrier layer 112 may be formed using any one of Ta, TaN, TaAlN, TaSiN, $TaSi_2$, Ti, TiN, TiSiN, WN, Co and $CoSi_2$.

Then, a seed layer 114 (hereinafter called 'first seed layer') is deposited in thickness of 300 through 1500 Å on the first barrier layer 112. For example, the first seed layer 114 may be formed using any one of Cu, Pt (platinum), Pd (palladium), Ru (rubidium), St (strontium), Rh (rhadium) and Co (cobalt).

Thereafter, an electroplating process is performed for the entire structure so that the via hole 110 is buried, thus depositing a copper electroplating film 116 (hereinafter called 'first electroplating film). The first electroplating film 116 is then crystallized by an annealing process.

Figure 1C:
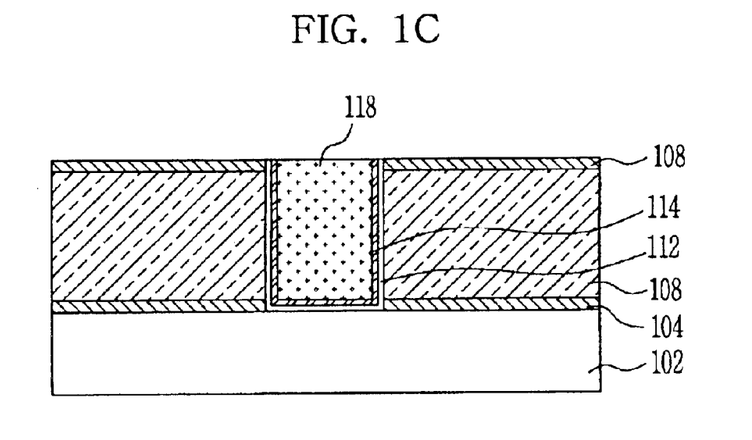

By reference to FIG. 1C, the first electroplating film 116 is experienced by a chemical mechanical polishing (CMP) process, so that the barrier layer 112, the seed layer 114 and the first electroplating film 116 that are deposited on the second etch stop layer 108 are removed to form a via plug 118.

Figure 1D:
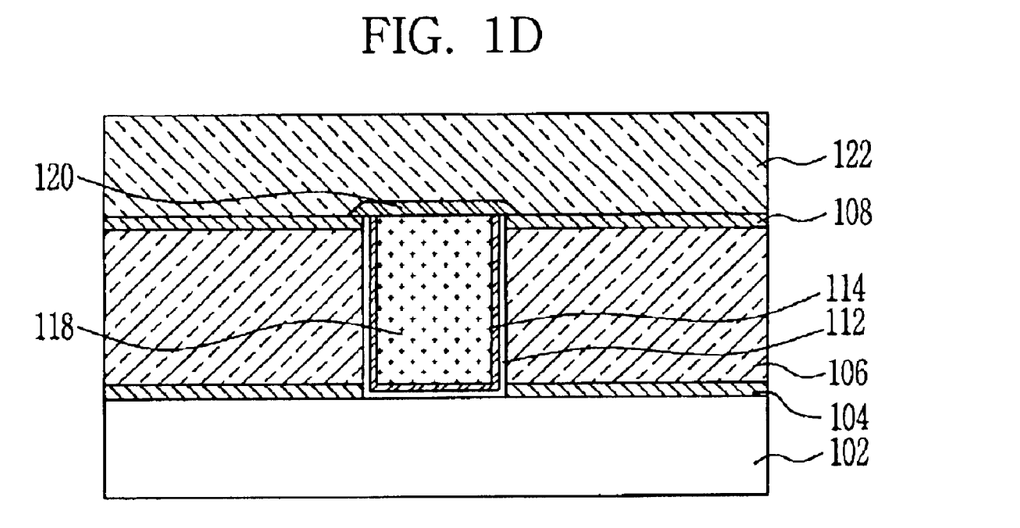

Referring to FIG. 1D, a buffer film 120 having a function of buffering a subsequent thermal stress is formed on the via plug 118 by selectively performing an electroless plating method or a chemical vapor deposition (CVD) method. At this time, it is preferred that the buffer film 120 is formed in thickness of 50 through 1000 Å using a CoW film, etc. In particular, the deposition thickness of the buffer film 120 may be varied depending on the design rule of the device and is determined by the capability that the exposure process is performed. Also, the buffer film 120 is formed to overlap with the via plug 118 and the second etch stop layer 108, as shown in the drawing.

Thereafter, an insulating film 122 (hereinafter called 'second interlayer insulating film') is deposited on the entire structure using a material of a low dielectric constant, for example, silicon oxide, fluorine-containing silicon oxide, fluorine-containing oxide, etc. At this time, it is preferred that the second interlayer insulating film 122 is thicker than the first interlayer insulating film 106.

Figure 1E:
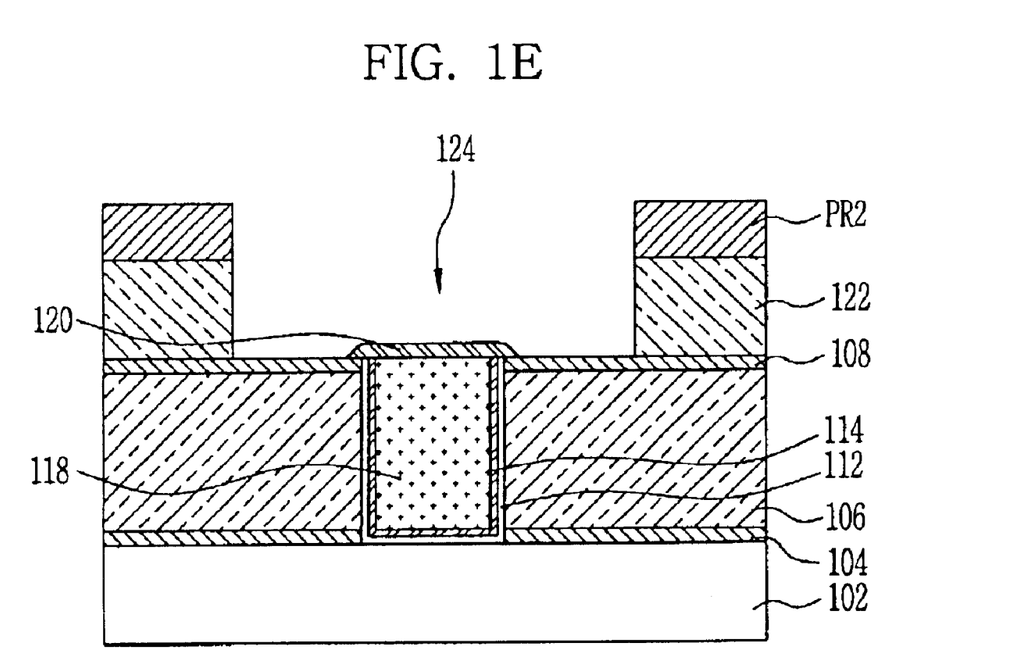

By reference to FIG. 1E, a photoresist (not shown) is coated on the entire structure using a single damascene process in order to form a single damascene pattern (i.e., trench). An exposure process and a development process are then sequentially performed using a photo mask, thus forming photoresist patterns PR2 for the trench on portions of the second interlayer insulating film 122 so that the patterns PR2 can have a profile shape of a subsequent trench plug 132 (hereinafter called 'copper metal line') (see FIG. 1G).

Next, the second interlayer insulating film 122 is etched by an etch process using the photoresist patterns PR2 as an etch mask, thus forming a region where the subsequent copper metal line 132 will be formed (hereinafter called 'trench') 124. Then, the photoresist pattern PR2 is removed by a strip process. At this time, it is preferred that the etch process is performed so that the buffer film 120 is not removed. Portions of the second etch stop layer 108 are exposed through the etch process.

Figure 1F:
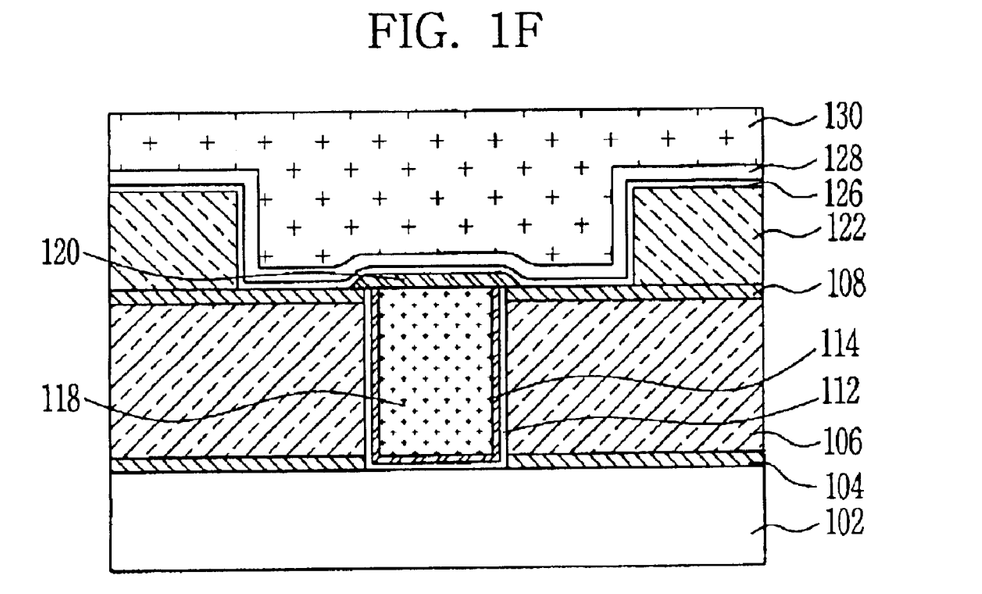

Referring to FIG. 1F, a barrier layer 126 (hereinafter called 'second barrier layer') having a function of preventing diffusion of Cu atoms is formed in thickness of 50 through 300 Å on the entire structure including the inner surface of the trench 124, that is, the inner surface and the bottom surface of the trench 124. For example, the second barrier layer 126 may be formed using any one of Ta, TaN, TaAlN, TaSiN, TaSi$_2$, Ti, TiN, TiSiN, WN, Co and CoSi$_2$.

Next, a seed layer 128 (hereinafter called 'second seed layer') is deposited in thickness of 300 through 1500 Å on the second barrier layer 126. For example, the second seed layer 128 may be formed using any one of Cu, Pt (platinum), Pd (palladium), Ru (rubidium), St (strontium), Rh (rhadium) and Co (cobalt).

Thereafter, an electroplating process is performed for the entire structure so that the trench 124 is buried, thus depositing a copper electroplating film 130 (hereinafter called 'second electroplating film'). Next, the second electroplating film 130 is crystallized by an annealing process.

Figure 1G:
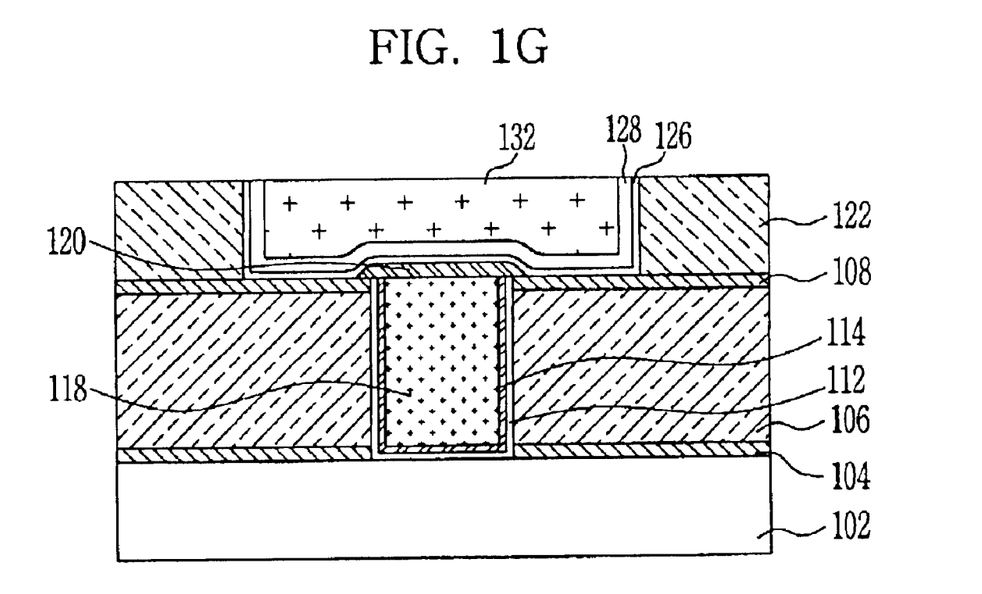

By reference to FIG. 1G, a chemical mechanical polishing (CMP) process is performed for the second electroplating film 130 in order to remove the second barrier layer 126, the second seed layer 128 and the second electroplating film 130 that are deposited on the second interlayer insulating film 122, thus forming a copper metal line 132.

A method of forming the copper metal line according to a second embodiment of the present invention will be below described. In particular, the second embodiment of the present invention presents the method of forming the copper metal line in which the process of forming the second barrier layer 126 formed in order to prevent diffusion of Cu (see FIG. 1F) is skipped from the method of forming the copper metal line according to the first embodiment. As the second embodiment of the present invention is same up to the processes of forming the trench 124 in the first embodiment (see up to FIG. 1E), the processes up to the process of forming the trench will be omitted, for convenience of explanation.

Figure 2A:
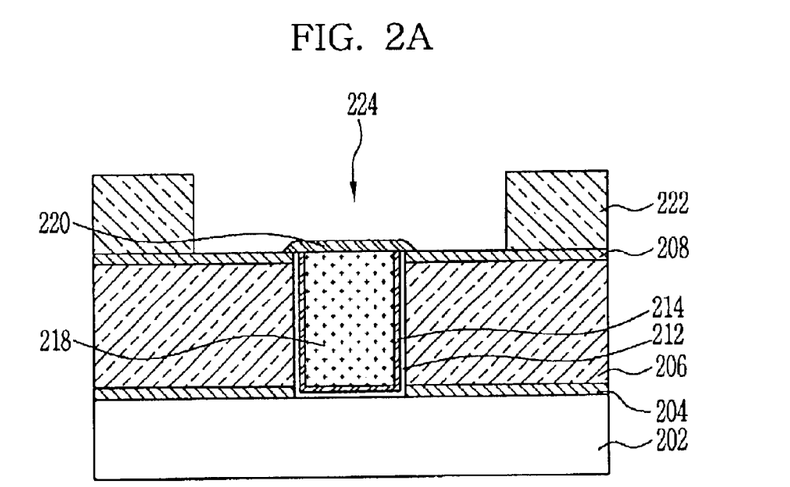
FIG. 2A through FIG. 2C are cross sectional views of semiconductor devices for explaining a method of forming a copper metal line according to a second embodiment of the present invention.
Figure 2B:
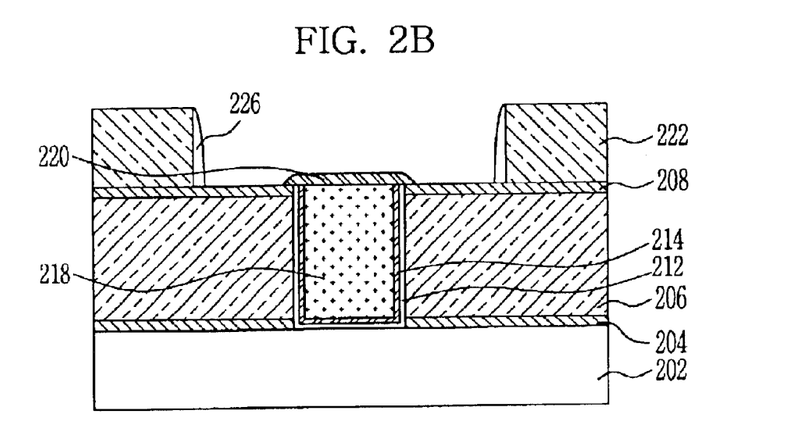
Figure 2C:
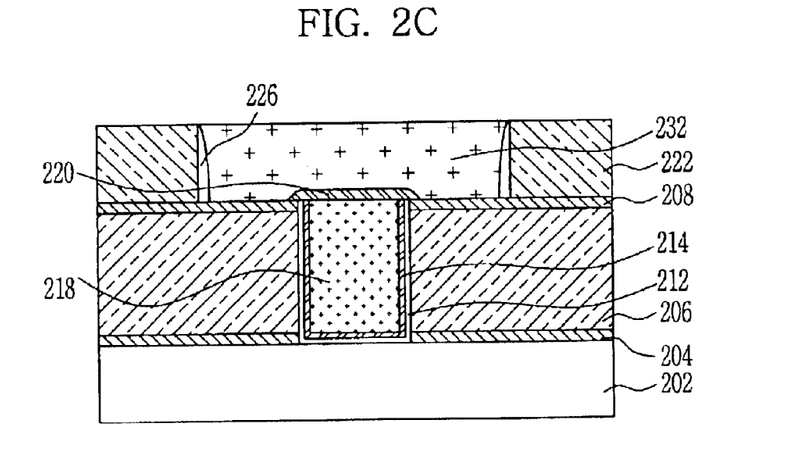

FIG. 2A through FIG. 2C are cross sectional views of the semiconductor devices for explaining the method of forming the copper metal line according to the second embodiment of the present invention.

Referring now to FIG. 2A, a first etch stop layer 204, a first interlayer insulating film 206, a second etch stop layer 208, a first barrier layer 212, a first seed layer 214, a via plug 218, a buffer film 220, a second interlayer insulating film 222 and a trench 224 are sequentially formed on a semiconductor substrate 202 in which a given lower (not shown) is formed. As described above, up to these processes are same to the method of forming the copper metal line according to the first embodiment of the present invention.

By reference to FIG. 2B, an insulating film (not shown) such as a SiN film, a cap oxide film, etc. is deposited on the entire structure. The insulating film is then etched by means of a blanket etch process, for example an etch back process using the buffer film 220 as an etch stop layer, thus forming a trench spacer 226 on the inner surface of the second interlayer insulating film 222. As such, as the trench spacer 226 is formed on the inner surface of the second interlayer insulating film 222, it is not necessary to form the second barrier layer 126 (see FIG. 1F) that was formed on the inner surface of the trench 124 (see FIG. 1E) in the first embodiment of the present invention.

Referring to FIG. 2C, a second seed layer (not shown) is deposited in thickness of 300 through 1500 Å on the inner surface of the trench 224. For example, the second seed layer may be formed using any one of Cu, Pt (platinum), Pd (palladium), Ru (rubidium), St (strontium), Rh (rhadium) and Co (cobalt).

Next, an electroplating process is performed for the entire structure so that the trench 224 is buried, thus depositing a copper electroplating film (not shown). The copper electroplating film is then crystallized by a rapid temperature process (RTP) or an annealing process.

Thereafter, a chemical mechanical polishing process is performed for the copper electroplating film, so that the electroplating film deposited on the second interlayer insulating film 222 is removed to form a copper metal line 232.

As mentioned above, according to the present invention, the buffer film is formed between the via plug and the copper metal line in order to prevent lowering in the yield of the via hole that occurs due to a thermal stress in the subsequent process. Therefore, the present invention has an advantageous effect that it can improve the yield of the copper metal line by preventing diffusion of Cu atoms.

Further, according to the present invention, the via plug and the copper metal line are independently formed by an independent single damascene process. Thus, it is possible to prevent damage of the conductive material in the conductive region and damage of the lower layer due to misalignment of the via hole and the underlying conductive region in the process of forming the trench. Therefore, the present invention has an advantageous effect that it can prevent conductive material atom from being re-sputtered on the inner surface of the via hole.

Also, after the trench is formed, the trench spacer is formed on the inner surface of the second interlayer insulating film in order to prevent diffusion of Cu atoms. Thus, the present invention has an outstanding advantage that it can obviate forming the barrier layer having a function of preventing diffusion of Cu atoms.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a copper metal line, comprising the steps of:
    (a) forming a first interlayer insulating film on a semiconductor substrate in which a lower layer is formed;
    (b) forming an etch stop layer on the first interlayer insulating film;
    (c) etching the etch stop layer and the first interlayer insulating film to form a via hole;
    (d) forming a via plug to bury the via hole;
    (e) forming a buffer film covering the via plug in order to buffer a stress applied in a subsequent etching process;
    (f) forming a second interlayer insulating film on the entire structure;
    (g) etching the second interlayer insulating film to form a trench, wherein the buffer film remains on the via plug; and
    (h) forming a copper metal line on the buffer film to bury the trench.

2. The method as claimed in claim 1, wherein the buffer film is selectively formed by means of an electroless plating method or a chemical vapor deposition method.

3. The method as claimed in claim 1, wherein the buffer film is formed in thickness of 50 Å through 1,000 Å using a CoW film.

4. The method as claimed in claim 1, further comprising the step of forming a barrier layer on an inner surface of the trench or the step of forming a trench spacer on the inner surface of the trench, before step (h).

5. The method as claimed in claim 4, wherein the trench spacer is formed using a SiN film.

* * * * *